United States Patent [19]
Matsuzaki et al.

[11] Patent Number: 5,386,345
[45] Date of Patent: Jan. 31, 1995

[54] ELECTROMAGNETIC SHIELDING MESH

[75] Inventors: Toru Matsuzaki, Nagoya; Akio Yamaguchi, Kasugai, both of Japan

[73] Assignee: Kitagawa Industries Co., Ltd., Japan

[21] Appl. No.: 154,635

[22] Filed: Nov. 18, 1993

Related U.S. Application Data

[63] Continuation of Ser. No. 861,120, Mar. 31, 1992.

[30] Foreign Application Priority Data

May 24, 1991 [JP] Japan .............................. 3-037323[U]

[51] Int. Cl.⁶ ............................................. H05K 9/00
[52] U.S. Cl. ................................ 361/816; 361/752; 361/796; 361/818; 174/35 R; 174/35 MS
[58] Field of Search ....................... 174/35 R, 35 MS; 361/818, 752, 796, 816

[56]   References Cited
U.S. PATENT DOCUMENTS

| | | | |
|---|---|---|---|
| Re. 33,256 | 7/1990 | Busby . | |
| 600,250 | 3/1898 | Reese | 428/593 |
| 3,764,277 | 10/1973 | Hollis | 428/593 |
| 4,247,737 | 1/1981 | Johnson et al. | 174/35 MS |
| 4,631,641 | 12/1986 | Brombal et al. | 361/424 |
| 4,662,967 | 5/1987 | Bogan et al. | 156/242 |
| 4,863,789 | 9/1989 | Arai . | |
| 5,028,739 | 7/1991 | Keyser et al. | 174/35 MS |
| 5,142,101 | 8/1992 | Matsuzaki et al. | 174/35 GC |

*Primary Examiner*—Leo P. Picard
*Assistant Examiner*—Young Whang
*Attorney, Agent, or Firm*—Davis, Bujold & Streck

[57]   ABSTRACT

A knitted or braided electromagnetic shielding material is formed by interweaving metallic or metal-clad wire rods, and each wire rod has a solder-plated layer on its surface. By heating the knitted or braided material, the wire rods are securely soldered to one another, thus preventing the knitted or braided material from loosening or disentangling, Furthermore, the contact resistance between the wire rods is reduced by the solder connections, thus enhancing the electromagnetic shielding effect of the knitted or braided material and further causing no difference in the electromagnetic shielding effect of the knitted or braided material in relation to its weaving direction. An electromagnetic shielding gasket clad with the knitted or braided material can be easily secured to a housing of electronic components, by using the solder-plated layers of the wire rods to melt the gasket thereto.

17 Claims, 8 Drawing Sheets

ELECTROMAGNETIC SHIELDING MESH

This is a continuation of copending application Ser. No. 07/861,120 filed on Mar. 31, 1992.

BACKGROUND OF THE INVENTION

This invention relates to a mesh, particularly knitted or braided, electromagnetic shielding material for shielding electromagnetic waves irradiated to or from electronic components or signal conductors.

These days, office equipment such as electronic typewriters and printers, household appliances such as washing machines and vacuum cleaners, automobiles equipped with electronic control systems for fuel injection and the like increasingly use electronic components such as microcomputers. Thus, the number of microcomputers is increasing, and so is the clock frequency of microcomputers. Electronic components are generating increasing amounts of electromagnetic noise, which leaks through gaps in the housing of the electronic components and may be transmitted through signal conductors to other electronic components, thus causing malfunctions or damage to the other electronic components.

To solve the above-mentioned problem, conventionally, a meshed metal is formed by knitting or braiding metallic wires or metal-clad non-metallic wires and this mesh metal is wrapped around an electrical wire or the like which is to be electromagnetically shielded. Alternatively, a meshed gasket is formed by coating an elastomer with the meshed metal, and this gasket is attached to gaps in the housing of electronic components, thus preventing electromagnetic waves from being irradiated into or from the electronic components.

Conventionally in the prior art, to prevent the meshed metal from loosening or disentangling, the ends of the meshed metal needed to be soldered or taped, or the entire meshed metal needed to be coated with resin or embedded in an elastic body. To secure the meshed gasket to the housing of the electronic equipment, the housing required a groove for receiving the meshed gasket.

SUMMARY OF THE INVENTION

Wherefore, an object of the invention is to provide a mesh, including knitted or braided, electromagnetic shielding material which can be easily secured to electronic equipment without the shielding material loosening or disentangling.

Other objects and benefits of the invention will become apparent from the detailed description which follows hereinafter when taken in conjunction with the drawing figures which accompany it.

To solve this and other objects, the invention provides a knitted or braided electromagnetic shielding material attached to an electronic component or a signal conductor for shielding electromagnetic waves generated by or irradiated to the electronic component or the signal conductor. The knitted or braided electromagnetic shielding material comprises a plurality of metallic linear materials or metal-clad linear non-metallic materials which are plated with solder layers and interwoven to form the knitted or braided electromagnetic shielding material.

BRIEF DESCRIPTION OF THE DRAWINGS

The invention will now be described, by way of example, with reference to the accompanying drawings, in which.

DETAILED DESCRIPTION OF THE PREFERRED EMBODIMENT

Figure 1:
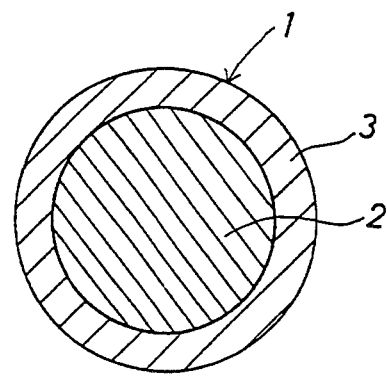
FIG. 1 is a cross-sectional view of a wire rod used for composing an electromagnetic shielding material of a first embodiment according to the invention.

As shown in FIG. 1, a wire rod 1 comprises a core 2 and a solder-plated layer 3. The core 2 is formed of a tinned copper wire, a welded copper wire, a Monel metal wire, a stainless steel wire, an aluminum wire, a tinned copper foil wire, or the like. A Monel metal is, as is known, an alloy mainly composed of nickel and copper. The tinned copper foil wire is formed by winding a tinned copper foil helically around polyester fibers, aramid fibers or polyimide fibers.

Figure 2:
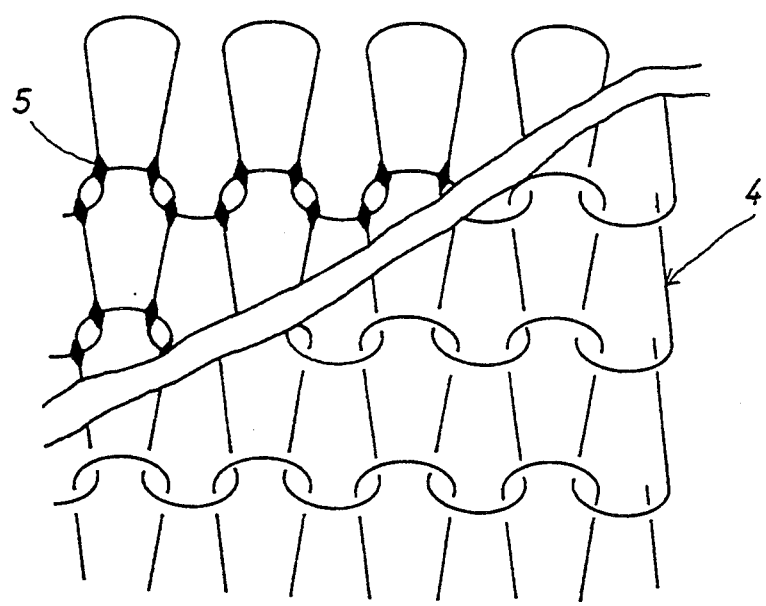
FIG. 2 is an explanatory view showing an electromagnetic shielding material formed by knitting the wire rods shown in FIG. 1.

FIG. 2 shows a knitted material 4 having an electromagnetic shielding effect and formed by knitting the wire rod 1 shown in FIG. 1. FIG. 2 is divided into upper and lower portions by a break strip: the lower portion shows the knitted material 4 before a heat treatment; and the upper portion shows the knitted material 4 after the heat treatment. As shown in the upper portion, the heat treatment of the knitted material 4 causes the wire rods 1 to be soldered and secured to one another at contact portions 5. Since the knitted material 4 is composed of the wire rods 1 having on their surfaces the solder-plated layers 3, by heating given points of the knitted material 4, the wire rods 1 are securely soldered to one another at the given points. Therefore, if cut or punched portions of the knitted material 4 are heated, the knitted material 4 is prevented from loosening or disentangling. By securely soldering the wire rods 1 to one another, the knitted material 4 is also prevented from contracting or expanding. In addition, the contact resistance among the wire rods 1 is reduced, thus enhancing the electromagnetic shielding effect of the knitted material 4. Therefore, the mesh size of the knitted material 4 can be made constant. The contact resistance in the extending direction of the wire rods 1 (corresponding to the lateral direction in FIG. 2) is different from that in the direction orthogonal to the extending direction (corresponding to the vertical direction in FIG. 2). Therefore, the electromagnetic shielding effect differs with the knitting direction of the knitted material 4. Such a difference in the contact resistance can be reduced when the wire rods 1 are securely soldered to one another.

Figure 3:
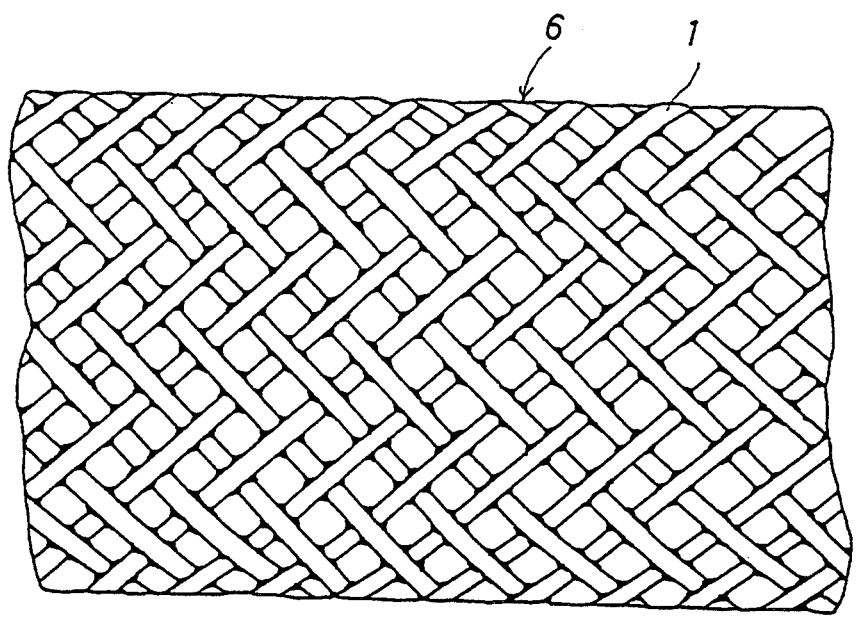
FIG. 3 is an explanatory view showing an electromagnetic shielding material formed by braiding the wire rods shown in FIG. 1.

As shown in FIG. 3, a braided material 6 has an electromagnetic shielding effect and is formed by braiding the wire rods 1 shown in FIG. 1. In the same way as the knitted material 4, by heating the braided material 6, the wire rods 1 can be securely soldered to one another. Therefore, the braided material 6 is prevented from loosening or disentangling and can provide a high electromagnetic shielding effect.

Figure 4:
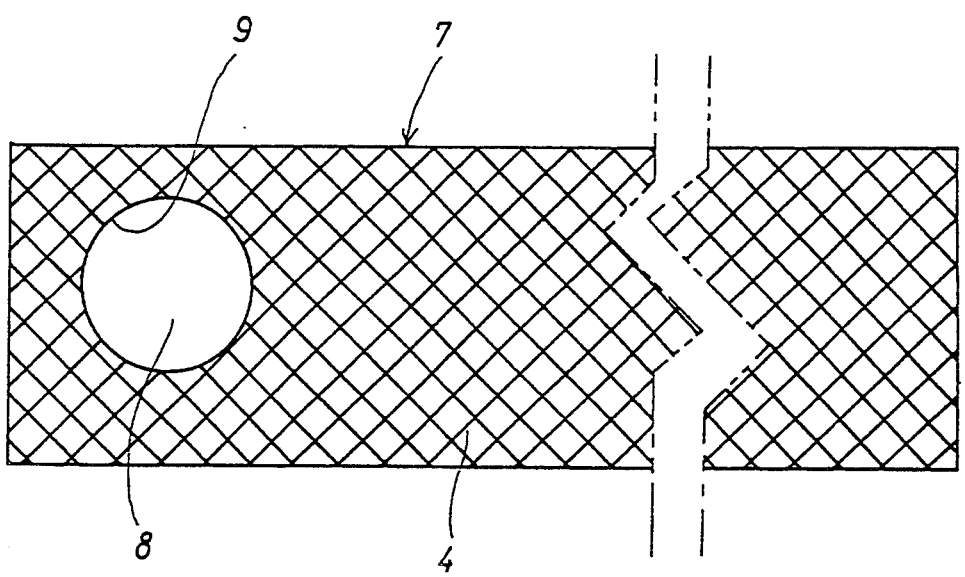
FIG. 4 is a front view of a meshwork having a screwing hole formed in the electromagnetic shielding material shown in FIG. 2.

As shown in FIG. 4, the knitted material 4 forms a strip-shaped meshwork 7 having a screwing hole 8 punched in one end of the meshwork 7. The knitted material 4 is heated before punching the screwing hole 8, such that the wire rods 1 are securely soldered to one another and the knitted material 4 is prevented from loosening or disentangling. A peripheral edge 9 of the screwing hole 8 is thus reinforced.

Figure 5:
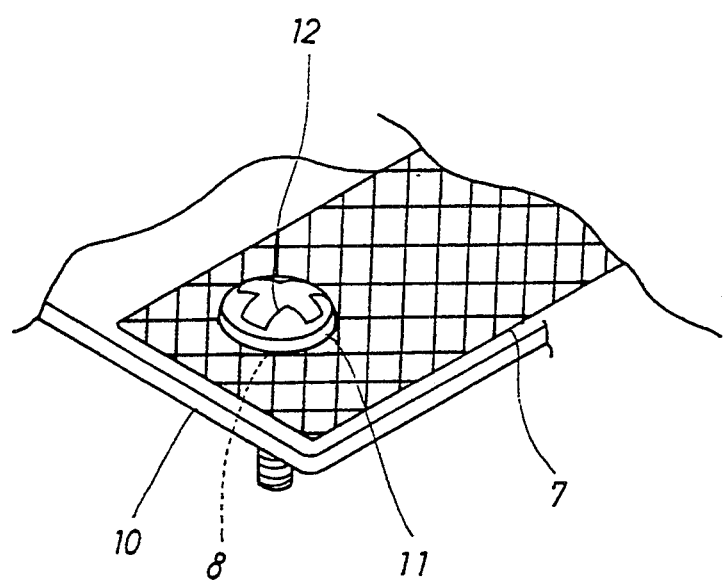
FIG. 5 is an explanatory view showing the operation of the meshwork shown in FIG. 4.

In operation, the meshwork 7 is first wrapped around a signal conductor (not shown) or other portions which need to be shielded from electromagnetic waves. As shown in FIG. 5, by inserting a small screw 12 with a washer 11 through the screwing hole 8, the end of the meshwork 7 is secured to a rim of a housing 10 of electronic components. When the signal conductor is wrapped in the knitted material 4 which is conductive, the knitted material 4 is electrically connected to the housing 10. Therefore, electromagnetic waves generated by the electronic components in the housing 10 or entering the housing 10 from the signal conductor are reflected and absorbed by the knitted material 4. The electronic components and the signal conductor are thus protected from the influence of electromagnetic waves.

Figure 6:
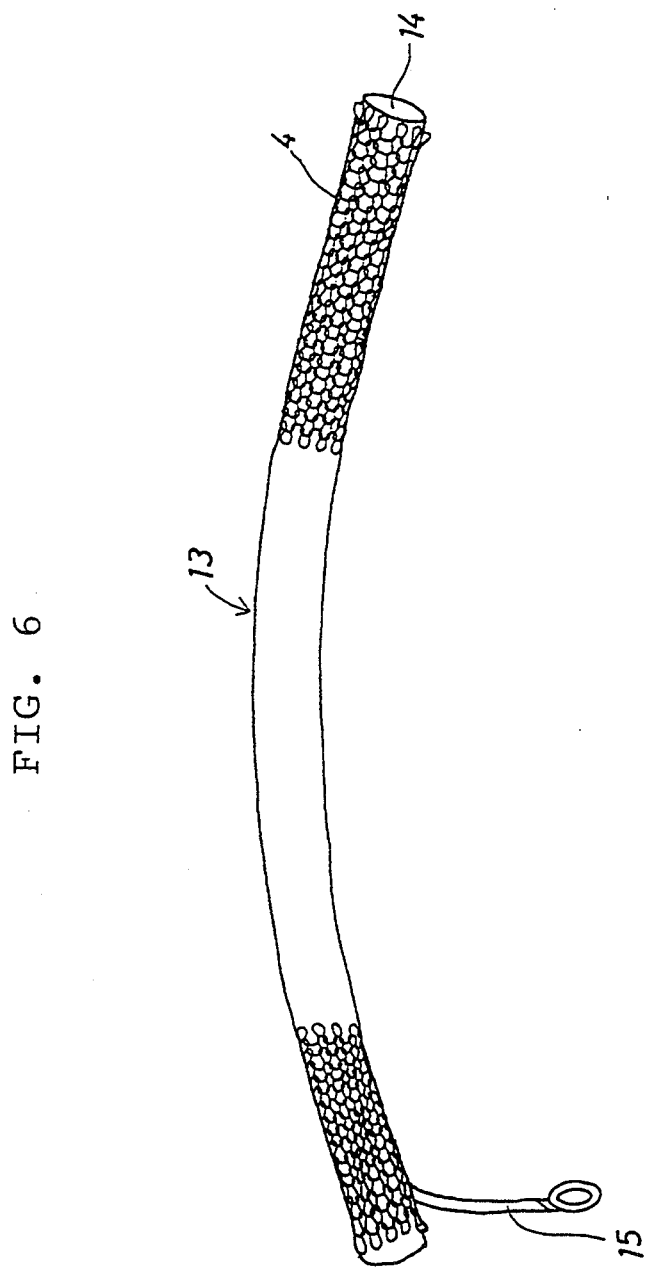
FIG. 6 is a perspective view of an electromagnetic shielding gasket clad with the electromagnetic shielding material shown in FIG. 2.

As shown in FIG. 6, a gasket 13 having an electromagnetic shielding effect is composed of an elastic body 14 clad with the knitted material 4 which is partially shown. The elastic body 14 is formed of silicone rubber, fluoro-silicone rubber, fluoro-rubber or other elastic material. Since the knitted material 4 is formed of the wire rods 1 having on their surfaces the solder-plated layers 3, a ground 15 can be easily attached to any portion of the gasket 13.

Figure 7:
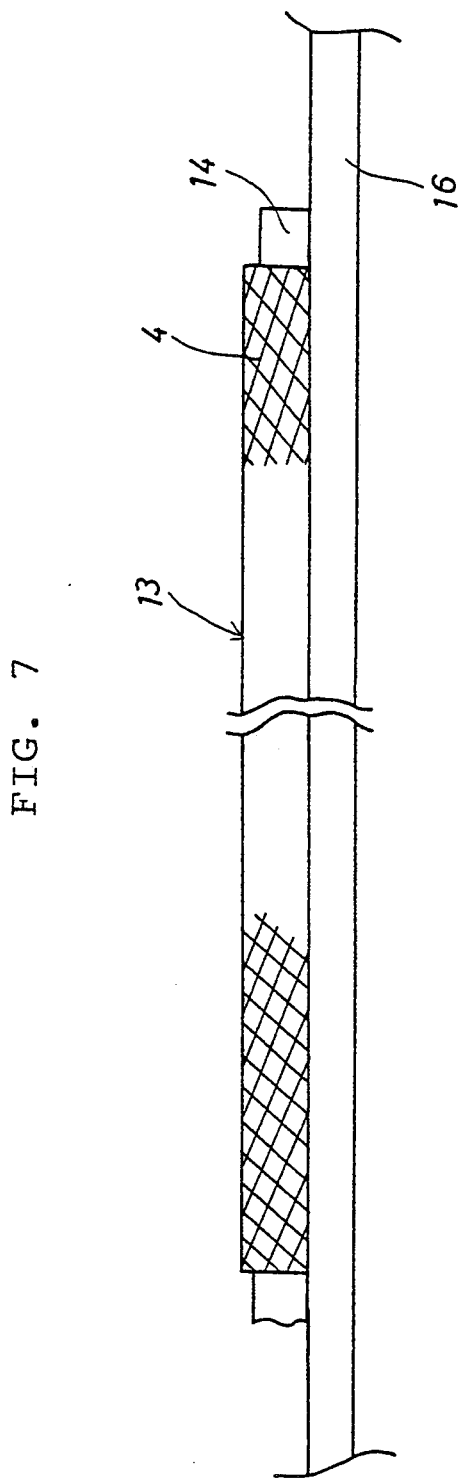
FIG. 7 is an explanatory view showing the electromagnetic shielding gasket attached to the housing of electronic equipment.
Figure 8:
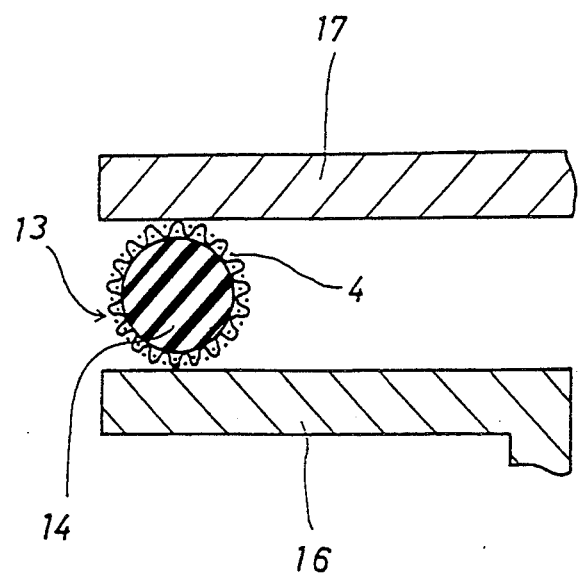
FIG. 8 is a cross-sectional view showing the housing with its lid member closed.

In operation, as shown in FIG. 7, the gasket 13 is attached to a rim of a housing 16 which encloses electronic components. By using the solder-plated layers 3 of the wire rods 1, the knitted material 4 of the gasket 13 can be easily secured to any given portion of the housing 16 by melting the knitted material 4 thereto. Thus, the housing 16 requires no grooves for securely receiving the gasket 13. Furthermore, since the wire rods 1 of the knitted material 4 are soldered and electrically connected to the housing 16, a higher electrical conductivity is established between the gasket 13 and the housing 16 as compared to a conventional gasket which is attached by a groove in a housing. When a lid 17 is closed, as shown in FIG. 8, electromagnetic waves generated by the electronic components in the housing 16 are reflected and absorbed by the knitted material 4 of the gasket 13, thus preventing the electromagnetic waves from leaking outside. At the same time, the electronic components are protected in the housing 16 from electromagnetic waves outside.

The invention has been described above with reference to a preferred embodiment as shown in the drawings. Modifications and alterations may become apparent to one skilled in the art upon reading and understanding the specification. Despite the use of embodiments for illustration purposes, however, it is intended to include all such modifications and alterations within the scope and spirit of the appended claims.

What is claimed is:

1. An electromagnetic shielding mesh material, in combination with a housing, comprising:

a plurality of at least partially plated conductive elongate members having a solder layer plated thereon along substantially the entire length of each said elongate member, said plurality of plated elongate members being interwoven with one another to form said electromagnetic shielding mesh material with portions of said plated elongate members contacting portions of adjacent plated elongate members, and said contacting portions of said adjacent plated elongate members being soldered together by heating said mesh material; and said mesh material being position in contact with said housing for absorbing electromagnetic waves and being solder to said housing by fusing the solder layer of said plated elongate members, which contact said housing, to said housing.

2. An electromagnetic shielding mesh material according to claim 1, wherein the elongate members are metallic.

3. An electromagnetic shielding mesh material according to claim 1, wherein the elongate members are a non-metallic material clad in metal.

4. An electromagnetic shielding mesh material according to claim 1, wherein the elongate members are wires formed of a material selected from the group consisting of copper, Monel metal, stainless steel and aluminum.

5. An electromagnetic shielding material according claim 1, wherein the electromagnetic shielding mesh material is one of knitted and braided and is prevented from contracting or expanding by said interconnected solder layers at said contacts.

6. An electromagnetic shielding mesh material according to claim 5, wherein the electrical contact resistance between said plurality of elongate members is reduced by said contacts.

7. An electromagnetic shielding mesh material according to claim 1, wherein the electromagnetic shielding mesh material is one of knitted or braided and is formed into a cylindrical configuration.

8. An electromagnetic shielding mesh material according to claim 7, wherein an elastic body is encapsulated within said cylindrical mesh material.

9. An electromagnetic shielding mesh material according to claim 8, wherein the elastic body is formed of a material selected from the group consisting of silicone rubber, fluoro-silicone rubber, and fluoro-rubber.

10. An electromagnetic shielding mesh material according to claim 7, wherein a ground means is connected to said solder layer on the plurality of elongate members.

11. An electromagnetic shielding mesh material comprising:

a plurality of at least partially plated conductive elongate members having a solder layer plated thereon along substantially the entire length of each said elongate member, said plurality of plated elongate members being interwoven with one another to form said electromagnetic shielding mesh material with portions of said plated elongate members contacting portions of adjacent plated elongate members, and said contacting portions of said adjacent plated elongate members being soldered together by heating said mesh material.

12. A mesh material formed by the process in claim 11, further comprising the step of:
   forming said elongate members out of a non-metallic material clad in metal.

13. A mesh material formed by the process in claim 11, comprising the further step of grounding said welded mesh material.

14. A mesh material formed by the process in claim 11, further comprising the steps of:
   shaping said interwoven plurality of elongate members into a cylinder configuration before heating said mesh material; and
   inserting a gasket material into said cylinder configuration.

15. A mesh material as formed by the process in claim 14, further comprising the step of positioning said cylinder configuration containing said gasket material therein at a location where electromagnetic waves are to be intercepted.

16. A process of forming electromagnetic shielding mesh material and connecting said mesh material to a housing, said process comprising the steps of:
   plating a plurality of elongate members with a solder layer substantially along the entire length of each elongate member;
   interweaving said plurality of plated elongate members, with the solder layer, to form a mesh material with portions of said elongate members contacting portions of adjacent plated elongate members;
   heating said formed mesh material so as to solder said solder layer of said contacting portions of said plated elongate members together and forming a cohesive mesh material;
   placing said cohesive mesh material in contact with said housing so that a portion of said plated elongate members contacts said housing; and
   soldering said sections of said plated elongate members, which contact said housing, to said housing by heating said mesh material and fusing said solder layers without utilizing additional solder material.

17. A mesh material formed by the process in claim 16, further comprising the steps of:
   interweaving said plurality of elongate members into a generally cylindrical configuration;
   encasing an elastic body within said interwoven generally cylindrical configuration mesh material to form a gasket; and
   soldering a portion of said gasket to said housing.

* * * * *